United States Patent
Wang et al.

(10) Patent No.: US 12,490,560 B2
(45) Date of Patent: Dec. 2, 2025

(54) DISPLAY PANEL AND MANUFACTURING METHOD THEREOF, AND DISPLAY DEVICE

(71) Applicants: BOE MLED Technology Co., Ltd., Beijing (CN); BOE TECHNOLOGY GROUP CO., LTD., Beijing (CN)

(72) Inventors: Chuhang Wang, Beijing (CN); Sha Feng, Beijing (CN); Chao Liu, Beijing (CN); Lili Wang, Beijing (CN); Mingming Jia, Beijing (CN); Jing Wang, Beijing (CN); Ming Zhai, Beijing (CN)

(73) Assignees: BOE MLED TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/796,091

(22) PCT Filed: Aug. 27, 2021

(86) PCT No.: PCT/CN2021/115102
§ 371 (c)(1),
(2) Date: Jul. 28, 2022

(87) PCT Pub. No.: WO2023/024094
PCT Pub. Date: Mar. 2, 2023

(65) Prior Publication Data
US 2024/0186470 A1  Jun. 6, 2024

(51) Int. Cl.
*H10H 20/857*  (2025.01)
*H01L 25/075*  (2006.01)
*H10H 20/01*  (2025.01)

(52) U.S. Cl.
CPC ....... *H10H 20/857* (2025.01); *H01L 25/0753* (2013.01); *H10H 20/0364* (2025.01)

(58) Field of Classification Search
CPC .. H10H 20/857; H10H 20/0364; H10K 71/00; H10K 2102/311; H10K 77/111; H10K 59/40; G09F 9/301
See application file for complete search history.

(56) References Cited

U.S. PATENT DOCUMENTS 9,488,857 B2 * 11/2016 Bornstein ............. G02F 1/1333
10,254,799 B2 * 4/2019 Nishikawa ............ G06F 1/1652
(Continued)

FOREIGN PATENT DOCUMENTS

CN  202813236 U   3/2013
CN  205844707 U   12/2016
(Continued)

OTHER PUBLICATIONS

Office Action issued on Oct. 31, 2024, in corresponding Chinese patent Application No. 202180002333.6, 20 pages.

*Primary Examiner* — Mamadou L Diallo
(74) *Attorney, Agent, or Firm* — XSENSUS LLP

(57) ABSTRACT

A display panel includes a display substrate having a display area and at least one wiring area, and a protective film including a first protective portion and at least one second protective portion. The first protective portion is disposed on a display side of the display substrate, and covers the display area. The at least one second protective portion each covers a wiring area in the at least one wiring area, and is bent from the display side of the display substrate to a non-display side of the display substrate, by a side of the display substrate. The at least one second protective portion each includes a main film layer and a wiring layer. The wiring layer includes a plurality of wirings. At least one wiring extends from the display side of the display substrate to the non-display side of the display substrate, by the side of the display substrate.

20 Claims, 11 Drawing Sheets

(56) References Cited

U.S. PATENT DOCUMENTS

| | | | |
|---|---|---|---|
| 2016/0066409 A1 | 3/2016 | Kwon et al. | |
| 2020/0310577 A1* | 10/2020 | Jeon | ........................ H10K 77/10 |
| 2021/0408411 A1 | 12/2021 | Wang et al. | |
| 2022/0100023 A1 | 3/2022 | Wang et al. | |
| 2022/0271059 A1* | 8/2022 | Feng | ................. G02F 1/136227 |
| 2023/0116734 A1* | 4/2023 | Onoue | ................... H10K 71/00 |
| | | | 257/88 |

FOREIGN PATENT DOCUMENTS

| | | | | | |
|---|---|---|---|---|---|
| CN | 107976725 | A | * | 5/2018 | |
| CN | 207440480 | U | | 6/2018 | |
| CN | 207541372 | U | | 6/2018 | |
| CN | 108281387 | A | | 7/2018 | |
| CN | 207800055 | U | | 8/2018 | |
| CN | 108847133 | A | | 11/2018 | |
| CN | 109166894 | A | | 1/2019 | |
| CN | 209149020 | U | | 7/2019 | |
| CN | 209515666 | U | | 10/2019 | |
| CN | 108847133 | B | * | 6/2020 | ............. G09F 9/301 |
| CN | 111933611 | A | * | 11/2020 | ............... G09F 9/33 |
| CN | 212246854 | U | | 12/2020 | |
| CN | 213240763 | U | | 5/2021 | |
| CN | 113053920 | A | | 6/2021 | |
| CN | 111933611 | B | * | 8/2023 | ............... G09F 9/33 |
| JP | 6736379 | B2 | * | 8/2020 | ....... G02F 1/133305 |

* cited by examiner

DISPLAY PANEL AND MANUFACTURING METHOD THEREOF, AND DISPLAY DEVICE

CROSS-REFERENCE TO RELATED APPLICATION

This application is a national phase entry under 35 USC 371 of International Patent Application No. PCT/CN 2021/115102 filed on Aug. 27, 2021, which is incorporated herein by reference in its entirety.

TECHNICAL FIELD

The present disclosure relates to the field of display technologies, and in particular, to a display panel and a manufacturing method thereof, and a display device.

BACKGROUND

Mini light-emitting diode (Mini LED) technology/Micro light-emitting diode (Micro LED) technology is referred to as the third generation display technology. In a process of manufacturing a Mini/Micro LED display panel, dead pixels are easy to occur in mass transfer LED chips, and the dead pixels are required to be repaired, which brings a challenge to the manufacturing of a large-size display panel (e.g., a display wall).

At present, small-size display panels may be spliced into the large-size display panel, thereby realizing the manufacturing of the large-size display panel.

SUMMARY

In an aspect, a display panel is provided. The display panel includes a display substrate and a protective film. The display substrate has a display area and at least one wiring area each located on a side of the display area. The protective film includes a first protective portion and at least one second protective portion. The first protective portion is disposed on a display side of the display substrate, and covers the display area. The at least one second protective portion each covers a wiring area in the at least one wiring area, and is bent from the display side of the display substrate to a non-display side of the display substrate, by a side of the display substrate. The at least one second protective portion each includes a main film layer and a wiring layer disposed on a side of the main film layer proximate to the display substrate. The wiring layer includes a plurality of wirings, and at least one wiring extends from the display side of the display substrate to the non-display side of the display substrate, by the side of the display substrate.

In some embodiments, the first protective portion includes a first black adhesive layer, the main film layer includes a second black adhesive layer, and the first black adhesive layer and the second black adhesive layer are integrally formed. The wiring layer is located on a side of the second black adhesive layer proximate to the display substrate.

In some embodiments, the first protective portion further includes a first white adhesive layer disposed on a side of the first black adhesive layer proximate to the display substrate. The main film layer further includes a second white adhesive layer disposed between the second black adhesive layer and the wiring layer. The first white adhesive layer and the second white adhesive layer are integrally formed.

In some embodiments, the second protective portion further includes a carrier layer disposed between the main film layer and the wiring layer. The wiring layer is fixed to the carrier layer, and the carrier layer is adhered to the main film layer.

In some embodiments, a material of the wiring layer includes a photosensitive conductive material.

In some embodiments, the first protective portion and the main film layer are integrally formed.

In some embodiments, the display substrate includes at least one first alignment mark. The protective film further includes at least one second alignment mark located on the display side of the display substrate. The at least one second alignment mark is configured to be aligned with the at least one first alignment mark to determine a relative position of the protective film and the display substrate.

In some embodiments, the display substrate further includes at least one third alignment mark. The protective film further includes at least one fourth alignment mark located on the non-display side of the display substrate. The at least one fourth alignment mark is configured to be aligned with the at least one third alignment mark to determine the relative position of the protective film and the display substrate.

In some embodiments, the second alignment mark and the plurality of wirings are made of a same material, and are arranged in a same layer. In a case where the protective film further includes the fourth alignment mark, the fourth alignment mark and the plurality of wirings are made of a same material, and are arranged in a same layer.

In some embodiments, the display substrate includes first pins and second pins that are all located in the wiring area. The first pins are disposed on the display side of the display substrate, and the second pins are disposed on the non-display side of the display substrate. An end of each of the at least one wiring is coupled to a first pin in the first pins, and another end of each of the at least one wiring is coupled to a second pin in the second pins.

In some embodiments, the at least one wiring area includes a first wiring area and a second wiring area respectively located on two opposite sides of the display area. The at least one second protective portion includes two second protective portions respectively located on two opposite sides of the first protective portion. One of the two second protective portions covers the first wiring area, and is bent from the display side of the display substrate to the non-display side of the display substrate, by a side of the display substrate corresponding to the first wiring area; and another one of the two second protective portions covers the second wiring area, and is bent from the display side of the display substrate to the non-display side of the display substrate, by another side of the display substrate corresponding to the second wiring area.

In another aspect, a display device is provided. The display device includes the display panel in any one of the above embodiments.

In yet another aspect, a manufacturing method of a display panel is provided. The display panel includes a display substrate, and the display substrate has a display area and at least one wiring area each located on a side of the display area. The manufacturing method includes following steps. A protective film is manufactured. The protective film includes a first protective portion and at least one second protective portion each located on a side of the first protective portion. The at least one second protective portion each includes a main film layer and a wiring layer disposed on a side of the main film layer, and the wiring layer includes a plurality of wirings.

The protective film is attached to the display substrate, so that the first protective portion is locate on a display side of the display substrate and covers the display area, and the at least one second protective portion each covers a wiring area in the at least one wiring area, and is bent from the display side of the display substrate to a non-display side of the display substrate, by a side of the display substrate. At least one wiring of the wiring layer extends from the display side of the display substrate to the non-display side of the display substrate, by the side of the display substrate.

In some embodiments, manufacturing the protective film, includes: forming a carrier layer on a substrate; forming a conductive film on the carrier layer; patterning the conductive film to form the wiring layer including the plurality of wirings; peeling the carrier layer carrying the wiring layer from the substrate; and attaching the carrier layer carrying the wiring layer to a preset position of a side of an initial protective film to obtain the protective film. The initial protective film includes the first protective portion and the main film layer of the second protective portion, and the preset position is a surface of the main film layer proximate to the display substrate.

In some embodiments, the display substrate includes at least one first alignment mark, and the protective film further includes at least one second alignment mark. Attaching the protective film to the display substrate, includes: aligning the second alignment mark of the protective film with the first alignment mark of the display substrate to determine a relative position of the protective film and the display substrate; and attaching the protective film to the display substrate.

In some embodiments, the protective film further includes a protective layer, and the protective layer covers the first protective portion and the second protective portion, and is located on a side of the main film layer away from the wiring layer. The manufacturing method further includes: removing the protective layer after the protective film is attached to the display substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
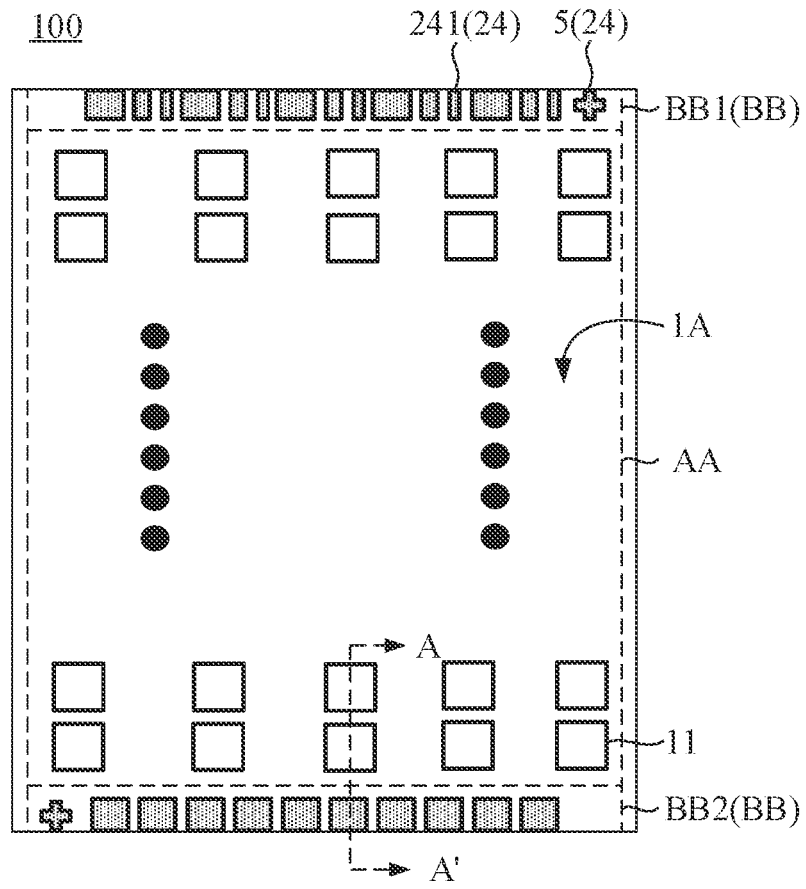
FIG. 1 is a plan view of a display side of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "coupled" and derivatives thereof may be used. For example, the term "coupled" may be used in the description of some embodiments to indicate that two or more components are in direct physical or electrical contact with each other.

The use of the phase "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

"Same layer" means that a film layer for forming a specific pattern is formed by a same film forming process, and then is patterned by one patterning process using a same mask to form a layer structure. Depending on different specific patterns, the one patterning process may include several exposure, development or etching processes, and the specific patterns in the formed layer structure may be continuous or discontinuous, and these specific patterns may also be at different heights or have different thicknesses.

Figure 21:
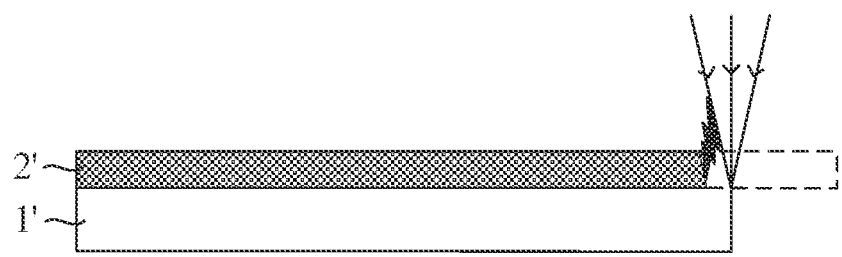
FIGS. 21 and 22 are diagrams showing steps of manufacturing a display panel in the related art.

In the related art, as shown in FIG. 21, in a process of manufacturing a Mini/Micro LED display panel, a protective film 2' is required to be attached to a surface of a display substrate 1', and then a portion of the protective film 2' exceeding the display substrate 1' is cut off by laser cutting. However, during laser cutting of the protective film 2', laser tends to cut an edge portion of the display substrate 1', and a film structure of the display substrate 1' at the edge portion thereof is damaged. Moreover, referring to FIG. 21, a cone-shaped heat affected zone is formed due to heat generated by laser cutting, which causes a portion of the protective film 2' that should cover the display substrate 1' to be cut off, resulting in light leakage from a corresponding region (i.e., a region non-covered by the protective film 2') of the display substrate 1'.

Figure 22:
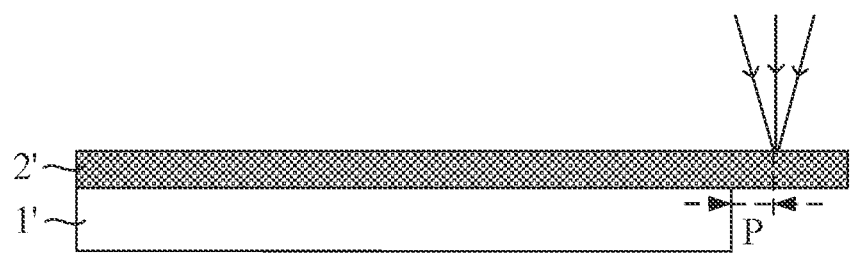

Therefore, as shown in FIG. 22, along a plane direction of the display substrate 1', a safety distance P is reserved between a position of the protective film 2' for laser cutting and the display substrate 1'. For example, the safety distance P is in a range of 68 µm to 72 µm, inclusive. For example, the safety distance P is 68 µm, 69 µm, 70 µm, 71 µm, or 72 µm. The safety distance P may avoid the damage of laser cutting to the display substrate 1', so as to avoid light leakage from an edge region of the display substrate 1'. However, when a plurality of display panels are spliced into a large-size display panel, the portion of the protective film 2' exceeding an edge of the display substrate 1' causes a non-display area between the display panels to be widened, which affects the display effect of the spliced large-size display panel.

Figure 2:
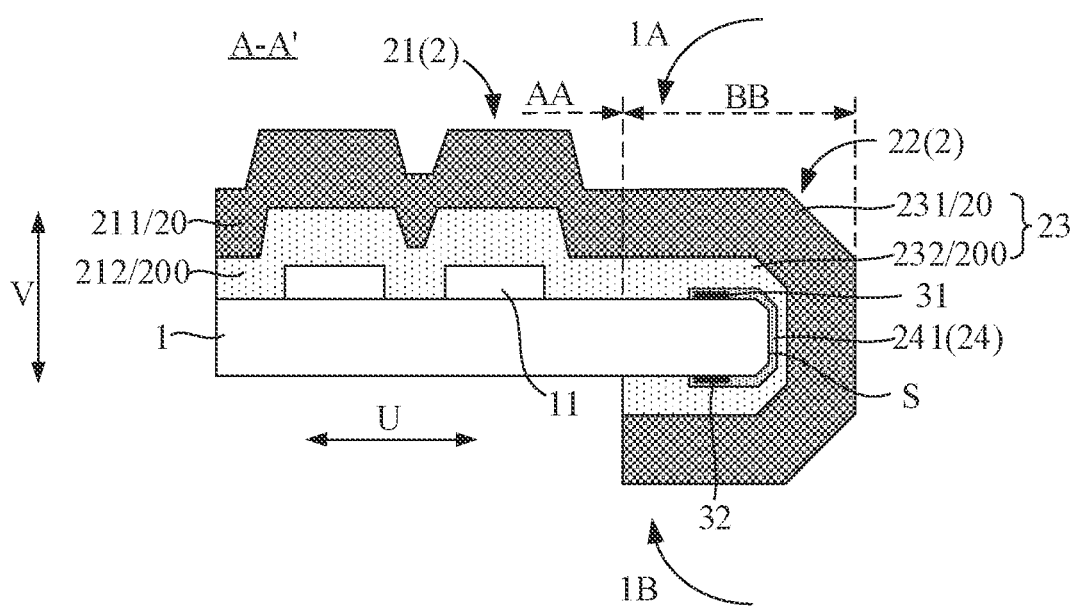
FIG. 2 is a sectional view of the display panel in FIG. 1 taken along the section line A-A'.

To solve the above problems, some embodiments of the present disclosure provide a display panel. As shown in FIGS. 1 and 2, the display panel 100 includes a display substrate 1 having a display area AA and wiring area(s) BB each located on a side of the display area AA. A plurality of light-emitting devices 11 are provided on the display substrate 1 in the display area AA. Each light-emitting device 11 is configured to emit light of a color, such as red light, green light, blue light or white light.

As shown in FIG. 2, the display panel 100 further includes a protective film 2 disposed on the display substrate 1, and the protective film 2 includes a first protective portion 21 and second protective portion(s) 22. The first protective portion 21 is disposed on a display side 1A of the display substrate 1, and covers the display area AA. The first protective portion 21 may be used for protecting a portion of the display side 1A of the display substrate 1 located in the display area AA.

As shown in FIG. 2, the second protective portion(s) 22 each cover a wiring area BB, and is bent from the display side 1A of the display substrate 1 to a non-display side 1B of the display substrate 1, by a side S of the display substrate 1.

As shown in FIG. 2, the second protective portion(s) 22 each include a main film layer 23 and a wiring layer 24 disposed on a side of the main film layer 23 proximate to the display substrate 1, and the wiring layer 24 is located in the wiring area BB. The wiring layer 24 includes a plurality of wirings 241. At least one wiring 241 extends from the display side 1A of the display substrate 1 to the non-display side 1B of the display substrate 1, by the side S of the display substrate 1. The main film layer 23 of the second protective portion 22 may be used for protecting the wiring layer 24 and a portion of the display side 1A of the display substrate 1 located in the wiring area BB.

It will be noted that referring to FIG. 2, a plane where a surface of the display substrate 1 located on the display side 1A is located is substantially parallel to a plane direction U of the display substrate 1. A plane where a surface of the display substrate 1 located on the non-display side 1B is located is substantially parallel to the plane direction U of the display substrate 1. The side S of the display substrate 1 connects the surface located on the display side 1A and the surface located on the non-display side 1B. The side S of the display substrate 1 may be planar, or the side S of the display substrate 1 may be non-planar. For example, the side S includes arc surface(s), or the side S includes a plurality of planes that are non-coplanar, or the side S includes arc surface(s) and plane(s).

Moreover, the wiring layer 24 is disposed on the side of the main film layer 23 proximate to the display substrate 1, so that in a process of attaching the protective film 2 to the display substrate 1, the wiring(s) 241 of the wiring layer 24 follow the second protective portion 22, and are bent from the display side 1A of the display substrate 1 to the non-display side 1B of the display substrate 1, by the side S of the display substrate 1.

Since the wiring layer 24 has a small thickness, the wiring layer 24 does not affect the attachment of the protective film 2 to the display substrate 1. For example, the thickness of the wiring layer 24 is in a range of 2 µm to 4 µm, inclusive. For example, the thickness of the wiring layer 24 is 2 µm, 2.5 µm, 3 µm, 3.5 µm, or 4 µm.

For example, all the wirings 241 included in the wiring layer 24 extend, from the display side 1A of the display substrate 1 to the non-display side 1B of the display substrate 1, by the side S of the display substrate 1.

In the display panel 100 in the embodiments of the present disclosure, the second protective portion 22 of the protective film 2 is bent from the display side 1A of the display substrate 1 to the non-display side 1B of the display substrate 1, by the side S of the display substrate 1. That is, along the plane direction U of the display substrate 1, a portion of the protective film 2 exceeding the display substrate 1 is bent to the non-display side 1B of the display substrate 1 by the side S of the display substrate 1, so that the portion of the protective film 2 exceeding the display substrate 1 may be prevented from being cut off by laser cutting, and the display substrate 1 is prevented from being damaged by cutting an edge portion of the display substrate 1. Moreover, the second protective portion 22 wraps the edge portion of the display substrate 1 (i.e., the wiring area BB and the side S of the display substrate 1), so that a problem of light leakage from an edge region of the display substrate 1 may be solved.

Moreover, compared with the case that the safety distance P is reserved between the position of the protective film 2' for laser cutting and the display substrate 1' in FIG. 22 such that the portion of the protective film 2' exceeding the edge of the display substrate 1' causes a wider splicing seam between the display panels (a width of the splicing seam is twice the safety distance P), referring to FIG. 2, a plurality of display panels 100 are spliced together, and a width of a splicing seam between two adjacent display panels 100 is twice a thickness, along the plane direction U, of a portion of the protective film 2 covering the side S (e.g., the thickness, along the plane direction U, of the portion of the protective film 2 covering the side S is in a range of 40 μm to 60 μm, inclusive, such as 40 μm, 45 μm, 50 μm, 55 μm, or 60 μm). Since the thickness, along the plane direction U, of the portion of the protective film 2 covering the side S is less than the safety distance P, the width of the splicing seam between two adjacent display panels 100 is reduced, so that a quality of a display image of the spliced large-size display panel may be improved.

In addition, the protective film 2 in the embodiments of the present disclosure has a structure that the wiring layer 24 manufactured in advance is disposed on the side of the main film layer 23 proximate to the display substrate 1. In this way, in the process of attaching the protective film 2 to the display substrate 1, the wiring(s) 241 of the wiring layer 24 follow the second protective portion 22, and are bent from the display side 1A of display substrate 1 to the non-display side 1B of display substrate 1 by the side S of the display substrate 1, so that the wiring(s) located on the side S may be manufactured, and the manufacturing process is simplified.

In some embodiments, a material of the wiring layer 24 includes a photosensitive conductive material.

It will be noted that in a process of manufacturing the wiring layer 24, a carrier layer 25 may be formed on a carrier platform, and then a conductive film is formed on a side of the carrier layer 25 away from the carrier platform. A material of the conductive film includes the photosensitive conductive material, so that the conductive film may be patterned by directly using exposure and development processes, so as to obtain the wiring layer 24. It will be understood that the first protective portion 21 may not include a carrier layer 25. That is, as shown in FIG. 3, only the second protective portion includes the carrier layer 25.

For example, the material of the wiring layer 24 includes photosensitive silver. For example, the wiring layer 24 may be a photosensitive silver dry film. Several structural designs of the protective film 2 will be described below in following embodiments.

Figure 3:
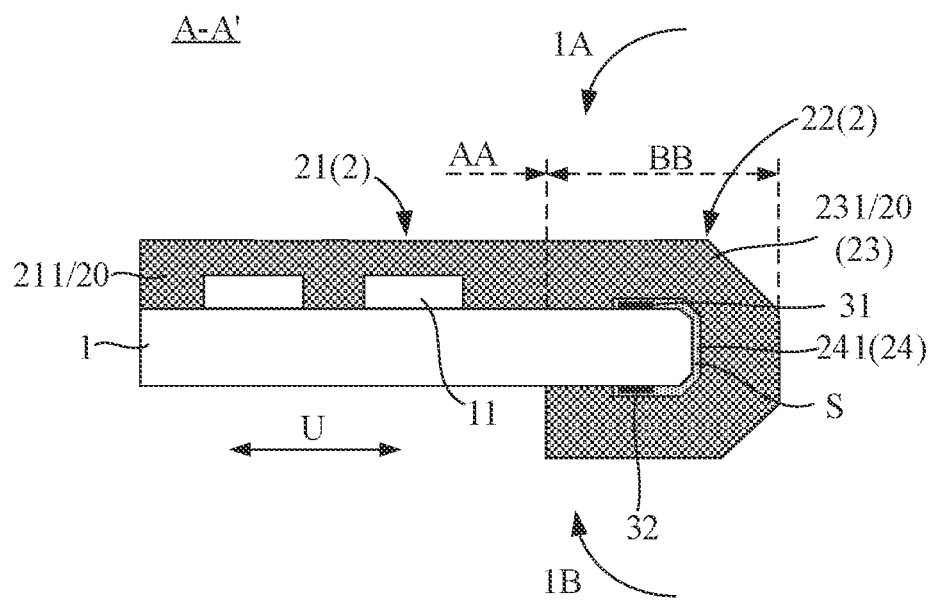
FIG. 3 is another sectional view of the display panel taken along the section line A-A', in accordance with some embodiments.

In some embodiments, as shown in FIG. 3, the first protective portion 21 includes a first black adhesive layer 211, and the main film layer 23 includes a second black adhesive layer 231. The first black adhesive layer 211 and the second black adhesive layer 231 are integrally formed, which is conducive to improving an integrity and a mechanical strength of the protective film 2. The wiring layer 24 is located on a side of the second black adhesive layer 231 proximate to the display substrate 1.

It will be understood that the protective film 2 includes a black adhesive layer 20 (including the first black adhesive layer 211 and the second black adhesive layer 231) and the wiring layer 24. The black adhesive layer 20 covers the display area AA and the wiring area BB, and the wiring layer 24 is located on the side of the second black adhesive layer 231 of the black adhesive layer 20 proximate to the display substrate 1.

For example, the wiring layer 24 may be directly adhered to the side of the second black adhesive layer 231 proximate to the display substrate 1.

In the above structural design of the protective film 2, the black adhesive layer 20 may blacken the surface of the display substrate 1 located on the display side 1A, and the black adhesive layer 20 may not only avoid the light leakage from the edge region of the display substrate 1, but also improve a brightness uniformity of display images in regions of the display panel 100, thereby improving an overall brightness uniformity of the display panel 100. In addition, the black adhesive layer 20 may further solve a problem of color cross-talk between different colors of light (e.g. red light, green light, and blue light) emitted from sub-pixels of the display panel 100.

It will be noted that referring to FIG. 3, a surface of the protective film 2 away from the display substrate 1 is flat, and a portion of the protective film 2 located on a surface of the light-emitting device 11 away from the display substrate 1 and a portion of the protective film 2 located between two adjacent light-emitting devices 11 have a difference in thickness. A thickness, in a direction perpendicular to the display substrate 1, of a portion of the first black adhesive layer 211 located between two adjacent light-emitting devices 11 may be greater than a thickness, in the direction perpendicular to the display substrate 1, of a portion of the first black adhesive layer 211 located on the surface of the light-emitting device 11 away from the display substrate 1. Since a gap exists between two adjacent light-emitting devices 11, after the protective film 2 is attached to the surface of the display substrate 1, the surface of the protective film 2 away from the display substrate 1 may be uneven. That is, compared with a surface, away from the display substrate 1, of the portion of the protective film 2 located between two adjacent light-emitting devices 11, a surface, away from the display substrate 1, of the portion of the protective film 2 located on the surface of the light-emitting device 11 away from the display substrate 1 has a greater distance from the display substrate 1.

In some embodiments, as shown in FIG. 2, the first protective portion 21 further includes a first white adhesive layer 212 disposed on a side of the first black adhesive layer 211 proximate to the display substrate 1. The main film layer 23 further includes a second white adhesive layer 232 disposed between the second black adhesive layer 231 and the wiring layer 24. The first white adhesive layer 212 and the second white adhesive layer 232 are integrally formed, which is conducive to improving the integrity and the mechanical strength of the protective film 2.

It will be understood that the protective film 2 includes the black adhesive layer 20, a white adhesive layer 200 (including the first white adhesive layer 212 and the second white adhesive layer 232) located on a side of the black adhesive layer 20 proximate to the display substrate 1, and the wiring layer 24. The wiring layer 24 is located on a side of the second white adhesive layer 232 of the white adhesive layer 200 proximate to the display substrate 1.

Moreover, the white adhesive layer 200 has a strong adhesion. Therefore, by using the above structure of the protective film 2, a connection strength between the wiring layer 24 and the white adhesive layer 200 may be improved, and a connection strength between the black adhesive layer 20 and the white adhesive layer 200 may be improved, thereby improving a connection strength between the wiring layer 24 and the black adhesive layer 20.

It will be noted that referring to FIG. 2, since the gap exists between two adjacent light-emitting devices 11, after the protective film 2 is attached to the surface of the display substrate 1, the surface of the protective film 2 away from the display substrate 1 may be uneven. Of course, in some cases, the surface of the protective film 2 away from the display substrate 1 is flat, and the portion of the protective film 2 located on the surface of the light-emitting device 11 away from the display substrate 1 and the portion of the protective film 2 located between two adjacent light-emitting devices 11 have a difference in thickness. The first white adhesive layer 212 may be disposed between two adjacent light-emitting devices 11, and the first white adhesive layer 212 and/or the first black adhesive layer 211 may be disposed on the surface of the light-emitting device 11 away from the display substrate 1. Alternatively, both the first white adhesive layer 212 and the first black adhesive layer 211 may be disposed between two adjacent light-emitting devices 11, and the first white adhesive layer 212 and/or the first black adhesive layer 211 may be disposed on the surface of the light-emitting device 11 away from the display substrate 1.

Figure 4:
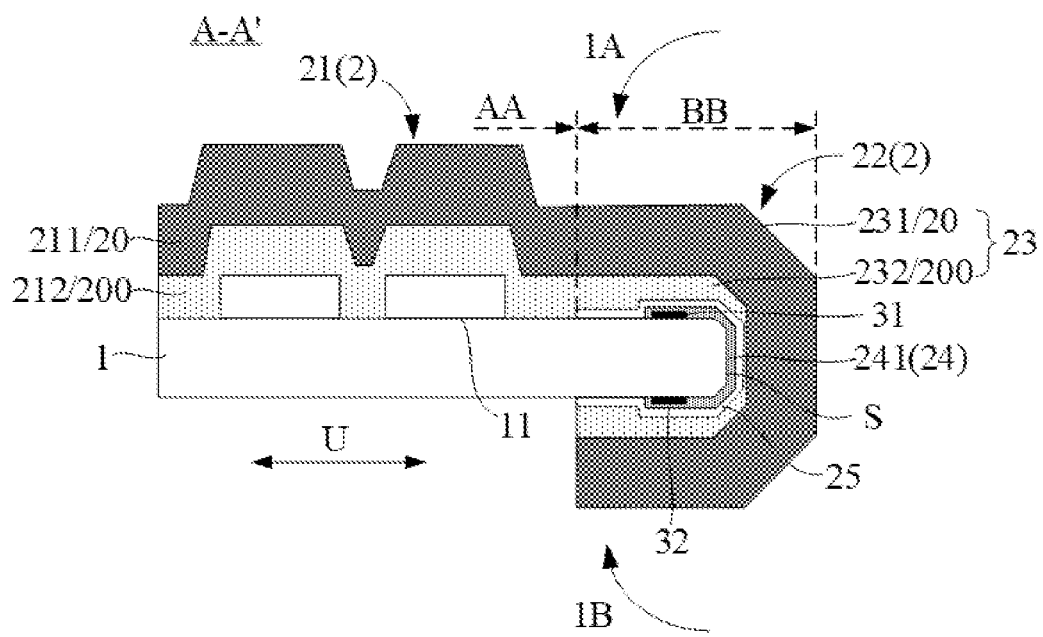
FIG. 4 is yet another sectional view of the display panel taken along the section line A-A', in accordance with some embodiments.

In some embodiments, as shown in FIG. 4, the second protective portion 22 further includes the carrier layer 25 disposed between the main film layer 23 and the wiring layer 24. The wiring layer 24 is fixed to the carrier layer 25, and the carrier layer 25 is adhered to the main film layer 23.

It will be understood that the protective film 2 includes the black adhesive layer 20, the white adhesive layer 200 located on the side of the black adhesive layer 20 proximate to the display substrate 1, the carrier layer 25 located on a side of the white adhesive layer 200 proximate to the display substrate 1, and the wiring layer 24. The wiring layer 24 is fixed to the carrier layer 25, and a surface of the carrier layer 25 away from the wiring layer 24 is adhered to the white adhesive layer 200.

By using the above structure of the protective film 2, the wiring layer 24 may be manufactured on the carrier layer 25 in advance, so that the carrier layer 25 serves as a carrier for the wiring layer 24, which may facilitate a transfer of the wiring layer 24. Moreover, the carrier layer 25 is adhered to the main film layer 23 of the protective film 2, so that the wiring layer 24 is attached to the main film layer 23 of the protective film 2.

For example, a material of the carrier layer 25 may include polyimide.

In some embodiments, as shown in FIGS. 2 to 4, the first protective portion 21 and the main film layer 23 are integrally formed, which is conducive to improving the integrity and the mechanical strength of the protective film 2.

For example, as shown in FIGS. 2 and 4, the first protective portion 21 includes the first black adhesive layer 211 and the first white adhesive layer 212, and the main film layer 23 includes the second black adhesive layer 231 and the second white adhesive layer 232. The first black adhesive layer 211 and the second black adhesive layer 231 are integrally formed, and the first white adhesive layer 212 and the second white adhesive layer 232 are integrally formed.

For example, as shown in FIG. 3, the first protective portion 21 includes the first black adhesive layer 211, and the main film layer 23 includes the second black adhesive layer 231. The first black adhesive layer 211 and the second black adhesive layer 231 are integrally formed.

Figure 7:
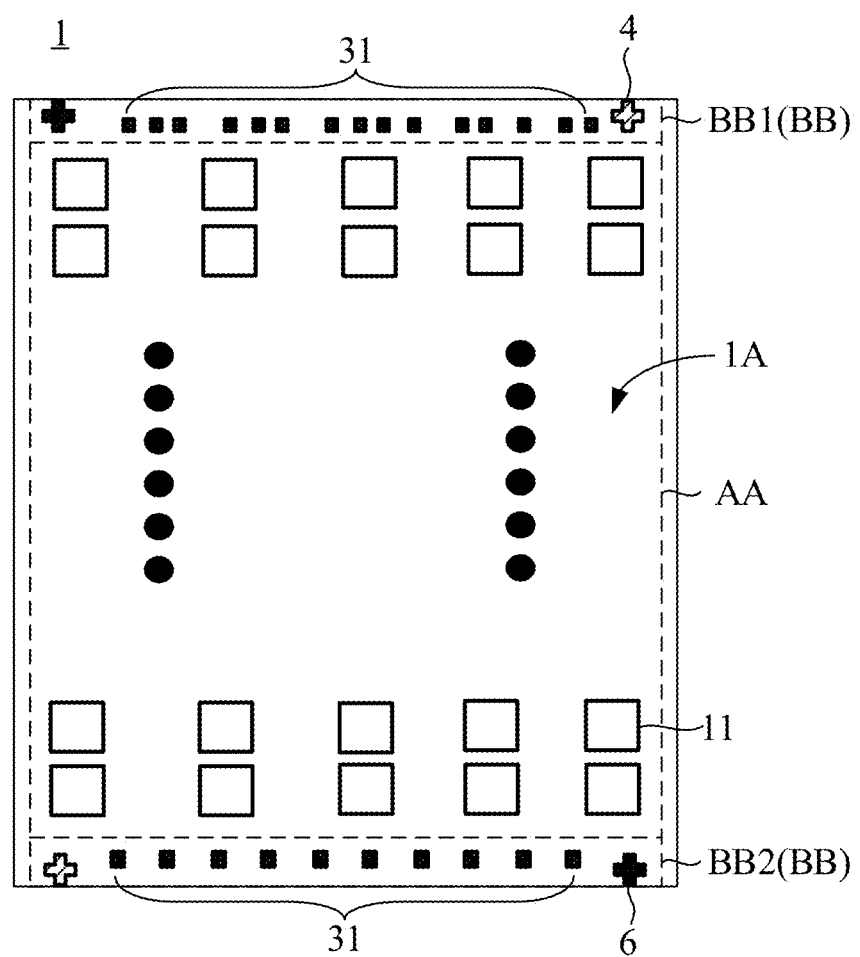
FIG. 7 is a plan view of a display substrate of a display panel, in accordance with some embodiments.

In some embodiments, as shown in FIG. 7, the display substrate 1 includes at least one first alignment mark 4.

It will be noted that the display substrate 1 includes a base, and a plurality of conductive patterns (for forming thin film transistors and signal lines) disposed on the base. The first alignment mark 4 may be of a single-layer structure. The first alignment mark(s) 4 and a conductive pattern are made of a same material, and are arranged in a same layer. Alternatively, the first alignment mark 4 is of a laminated structure. Each layer in the laminated structure and a conductive pattern are made of a same material, and are arranged in a same layer.

Figure 6:
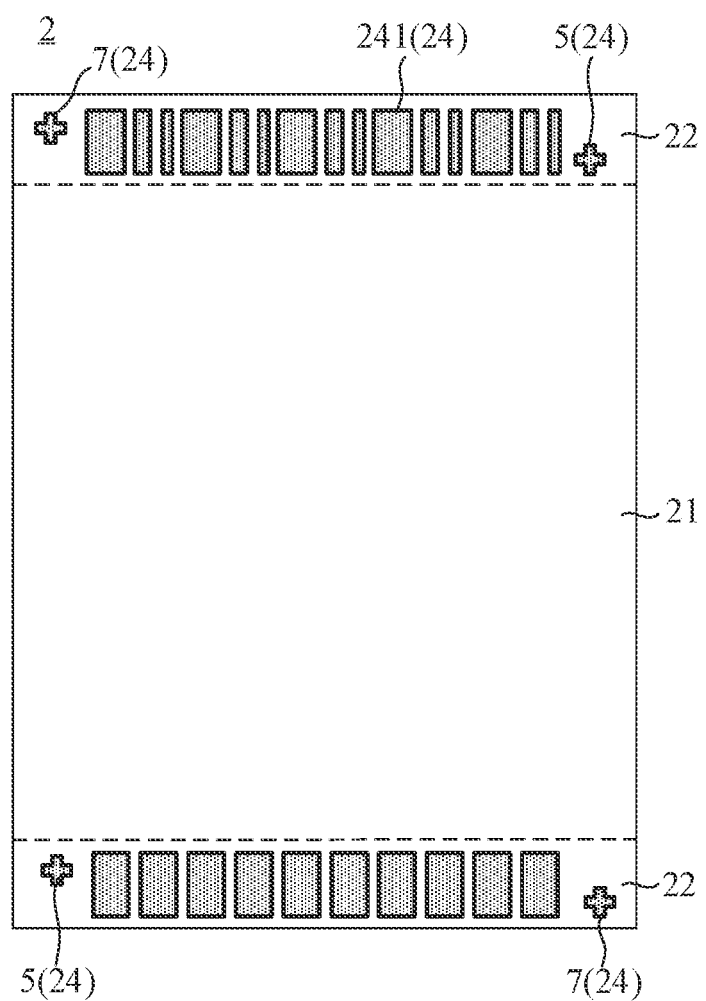
FIG. 6 is a plan view of a protective film of a display panel, in accordance with some embodiments.

As shown in FIGS. 1 and 6, the protective film 2 further includes at least one second alignment mark 5 located on the display side 1A of the display substrate 1. The at least one second alignment mark 5 is configured to be aligned with the at least one first alignment mark 4, so as to determine a relative position of the protective film 2 and the display substrate 1.

It will be noted that the "alignment" includes various design manners. For example, an outline of the first alignment mark 4 has substantially the same shape as an outline of the second alignment mark 5. In this case, the "alignment" may mean that the outline of the first alignment mark 4 substantially coincides with the outline of the second alignment mark 5 in a thickness direction V of the display substrate 1 (i.e., the direction perpendicular to the display substrate 1). For another example, the outline of the first alignment mark 4 and the outline of the second alignment mark 5 are not limited in shape, and the "alignment" may mean that along the plane direction U of the display substrate 1, a distance between a center of the first alignment mark 4 and a center of the second alignment mark 5 is less than or equal to a preset distance value.

By using the above structure of the protective film 2 in which the protective film 2 is provided with the at least one second alignment mark 5, in the process of attaching the protective film 2 to the display substrate 1, the second alignment mark 5 of the protective film 2 is aligned with the first alignment mark 4 of the display substrate 1, so that the relative position of the protective film 2 and the display substrate 1 may be determined, so as to accurately control a position of the protective film 2 attached to the display substrate 1.

For example, as shown in FIG. 7, the display substrate 1 has a quadrilateral shape, and has four corners. In this case, the display substrate 1 includes two first alignment marks 4 respectively disposed at corners on a diagonal line of the display substrate 1. Accordingly, as shown in FIGS. 1 and 6, the protective film 2 includes two second alignment marks 5. Along the thickness direction V of the display substrate 1, the second alignment marks 5 are in one-to-one correspondence with the first alignment marks 4, and a second alignment mark 5 is aligned with a corresponding first alignment mark 4.

For example, the outline of the first alignment mark 4 may be cross-shaped, circular, or triangular. The outline of the second alignment mark 5 may be cross-shaped, circular, or triangular.

In some embodiments, as shown in FIG. 7, the display substrate 1 further includes at least one third alignment mark 6. An arrangement of the third alignment mark(s) 6 may be the same as the arrangement of the first alignment mark(s) 4. That is, the third alignment mark 6 may be of a single-layer structure. The third alignment mark(s) 6 and a conductive pattern are made of a same material, and are arranged in a same layer. Alternatively, the third alignment mark 6 is of a laminated structure. Each layer in the laminated structure and a conductive pattern are made of a same material, and are arranged in a same layer.

Figure 5:
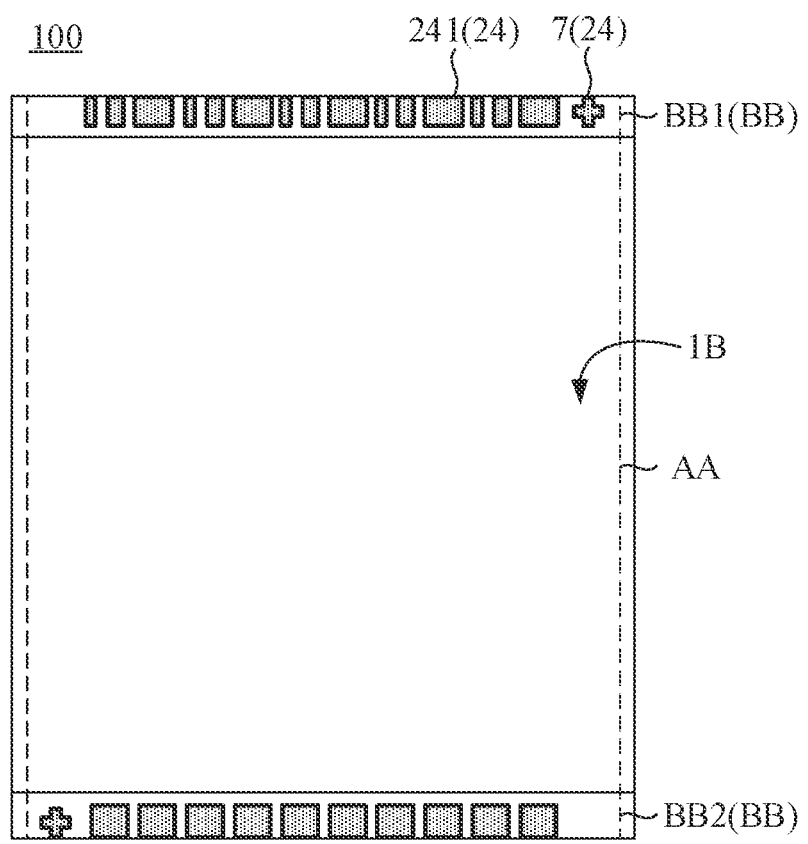
FIG. 5 is a plan view of a non-display side of a display panel, in accordance with some embodiments.

As shown in FIGS. 5 and 6, the protective film 2 further includes at least one fourth alignment mark 7 located on the non-display side 1B of the display substrate 1. The at least one fourth alignment mark 7 is configured to be aligned with the at least one third alignment mark 6, so as to determine the relative position of the protective film 2 and the display substrate 1.

By using the above structure of the protective film 2 in which the protective film 2 is provided with the at least one fourth alignment mark 7, in the process of attaching the protective film 2 to the display substrate 1, firstly, the protective film 2 is attached to the display side 1A of the display substrate 1, then the second protective portion 22 of the protective film 2 is bent to the non-display side 1B of the display substrate 1 by the side S of the display substrate 1, and the fourth alignment mark 7 of the protective film 2 is aligned with the third alignment mark 6 of the display substrate 1, so that a relative position of the second protective portion 22 of the protective film 2 and the display substrate 1 on the non-display side 1B may be determined, so as to accurately control a position of the second protective portion 22 of the protective film 2 attached to the non-display side 1B of the display substrate 1.

For example, as shown in FIG. 7, the display substrate 1 has the quadrilateral shape, and has the four corners. In this case, the display substrate 1 includes two third alignment marks 6 respectively disposed at corners on a diagonal line of the display substrate 1. Accordingly, as shown in FIGS. 5 and 6, the protective film 2 includes two fourth alignment marks 7. Along the thickness direction V of the display substrate 1, the fourth alignment marks 7 are in one-to-one correspondence with the third alignment marks 6, and a fourth alignment mark 7 is aligned with a corresponding third alignment mark 6.

For example, an outline of the third alignment mark 6 may be cross-shaped, circular, or triangular. An outline of the fourth alignment mark 7 may be cross-shaped, circular, or triangular.

In some embodiments, as shown in FIG. 6, the second alignment mark(s) 5 and the plurality of wirings 241 are made of a same material, and are arranged in a same layer. That is, the wiring layer 24 further includes the second alignment mark(s) 5.

It will be understood that in the process of manufacturing the wiring layer 24, the plurality of wirings 241 and the second alignment mark(s) 5 may be manufactured by using one patterning process, and the wirings 241 and the second alignment mark(s) 5 are adhered to the main film layer 23 of the protective film 2 along with the carrier layer 25.

In some embodiments, as shown in FIG. 6, the fourth alignment mark(s) 7 and the plurality of wirings 241 are made of a same material, and are arranged in a same layer. That is, the wiring layer 24 further includes the fourth alignment mark(s) 7.

It will be understood that in the process of manufacturing the wiring layer 24, the plurality of wirings 241 and the fourth alignment mark(s) 7 may be manufactured by using one patterning process, and the wirings 241 and the fourth alignment mark(s) 7 are adhered to the main film layer 23 of the protective film 2 along with the carrier layer 25.

In addition, in some embodiments, as shown in FIGS. 2 and 7, the display substrate 1 further includes first pins 31 and second pins 32 that are all located in the wiring area BB. The first pins 31 are disposed on the display side 1A of the display substrate 1, and the second pins 32 are disposed on the non-display side 1B of the display substrate 1. An end of each of the at least one wiring 241 is coupled to a first pin 31, and another end of each of the at least one wiring 241 is coupled to a second pin 32.

It will be noted that the first pins 31 are configured to be coupled to the plurality of conductive patterns located in the display area AA, and the second pins 32 are configured to be coupled to an external circuit. The end of the wiring 241 is coupled to the first pin 31, and the another end of the wiring 241 is coupled to the second pin 32, so that the plurality of conductive patterns may be coupled to the external circuit. The at least one wiring 241 is used for transmitting a signal provided by the external circuit to driving circuits.

It can be seen that in the structure of the protective film 2, in the process of attaching the protective film 2 to the display substrate 1, an electrical contact between the wiring 241 and the first pin 31 and an electrical contact between the wiring 241 and the second pin 32 are also realized, so that the manufacturing process of the wiring(s) located on the side S is simplified. Moreover, by controlling the position of the protective film 2 attached to the display substrate 1, an electrical contact between the wiring 241 and a corresponding pin is ensured.

In some embodiments, as shown in FIGS. 1, 5, and 7, the display substrate 1 has a first wiring area BB1 and a second wiring area BB2 respectively located on two opposite sides of the display area AA. The protective film 2 includes the first protective portion 21 and two second protective portions 22. The first protective portion 21 is disposed on the display side 1A of the display substrate 1, and covers the display area AA.

The two second protective portions 22 are located on two opposite sides of the first protective portion 21, respectively. A second protective portion 22 covers the first wiring area BB1, and is bent from the display side 1A of the display substrate 1 to the non-display side 1B of the display substrate 1, by a side S of the display substrate 1 corresponding to the first wiring area BB1. Another second protective portion 22 covers the second wiring area BB2, and is bent from the display side 1A of the display substrate 1 to the non-display side 1B of the display substrate 1, by another side S of the display substrate 1 corresponding to the second wiring area BB2.

Figure 8:
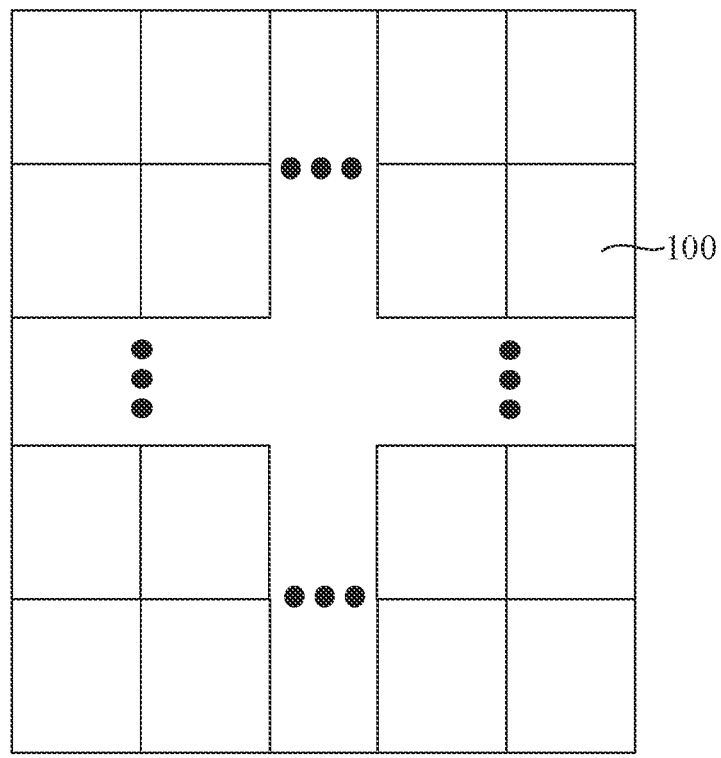
FIG. 8 is a structural diagram of a display device, in accordance with some embodiments.

Some embodiments of the present disclosure further provide a display device. As shown in FIG. 8, the display device 300 includes a plurality of display panels 100 in any one of the above embodiments. The display device 300 is formed by splicing the plurality of display panels 100.

The display device 300 may be a mini LED display device or a micro LED display device.

In the display device 300 in the embodiments of the present disclosure, in the process of manufacturing the display panels 100 in the display device 300, the portion of the protective film 2 exceeding the display substrate 1 may be prevented from being cut off by laser cutting, so that the display substrate 1 is prevented from being damaged by cutting the edge portion of the display substrate 1. Moreover, the second protective portion 22 wraps the edge portion of the display substrate 1 (i.e., the wiring area BB and the side S of the display substrate 1), so that the problem of light leakage from the edge region of the display substrate 1 may be solved.

Moreover, in the display device 300, the width of the splicing seam between two adjacent display panels 100 is reduced, so that the quality of the display image of the spliced large-size display panel may be improved.

In addition, the protective film 2 has the structure that the wiring layer 24 manufactured in advance is disposed on the side of the main film layer 23 proximate to the display substrate 1. In this way, in the process of attaching the protective film 2 to the display substrate 1, the wiring(s) 241 of the wiring layer 24 follow the second protective portion 22, and are bent from the display side 1A of display substrate 1 to the non-display side 1B of display substrate 1 by the side S of the display substrate 1, so that the wiring(s) located on the side S are manufactured. Moreover, a short circuit of the display area due to penetration of a conductive material into the display area by sputtering is avoided.

Some embodiments of the present disclosure further provide a manufacturing method of a display panel. For example, the manufacturing method may be applied to the display panel 100 shown in FIG. 1. The display panel 100 includes a substrate 1 having a display area AA and wiring area(s) BB each located on a side of the display area AA.

Figure 9:
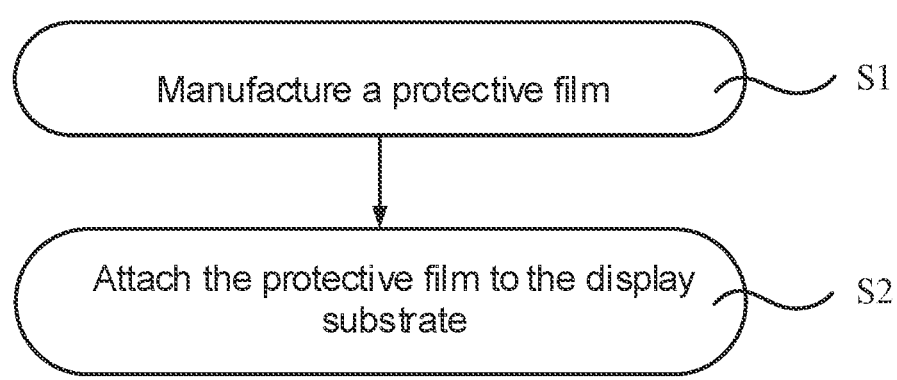
FIG. 9 is a flow diagram of a manufacturing method of a display panel, in accordance with some embodiments.

As shown in FIG. 9, the manufacturing method of the display panel 100 includes following S1 and S2.

Figure 18:
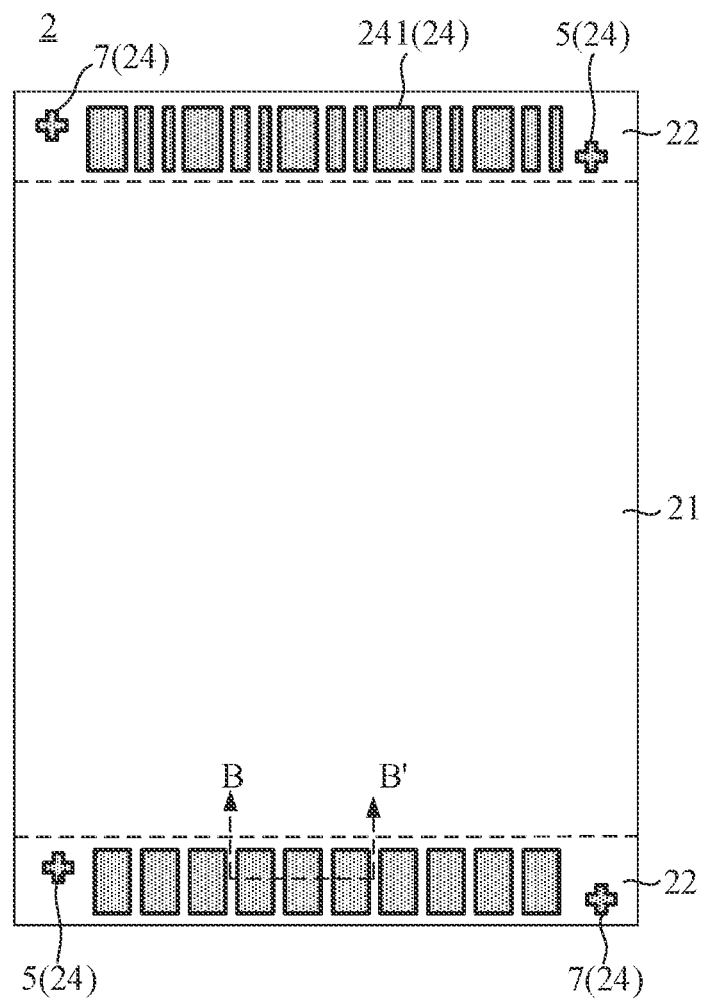
Figure 19:
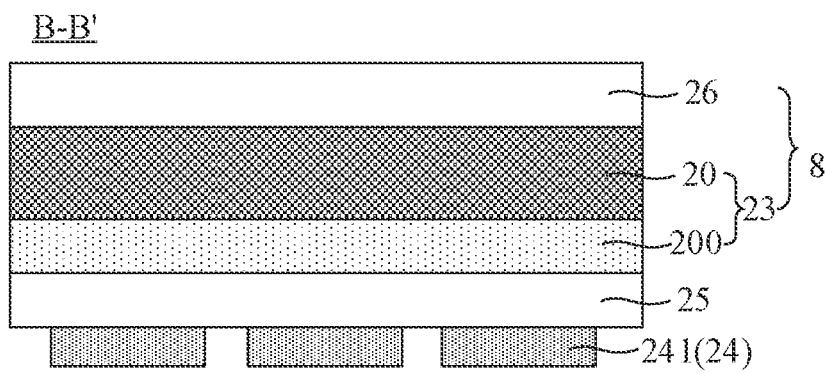

In S1, a protective film 2 is manufactured. Referring to FIGS. 18 and 19, the protective film 2 includes a first protective portion 21 and second protective portion(s) 22 each located on a side of the first protective portion 21. The second protective portion(s) 22 each include a main film layer 23 and a wiring layer 24 disposed on a side of the main film layer 23. The wiring layer 24 includes a plurality of wirings 241.

Figure 10:
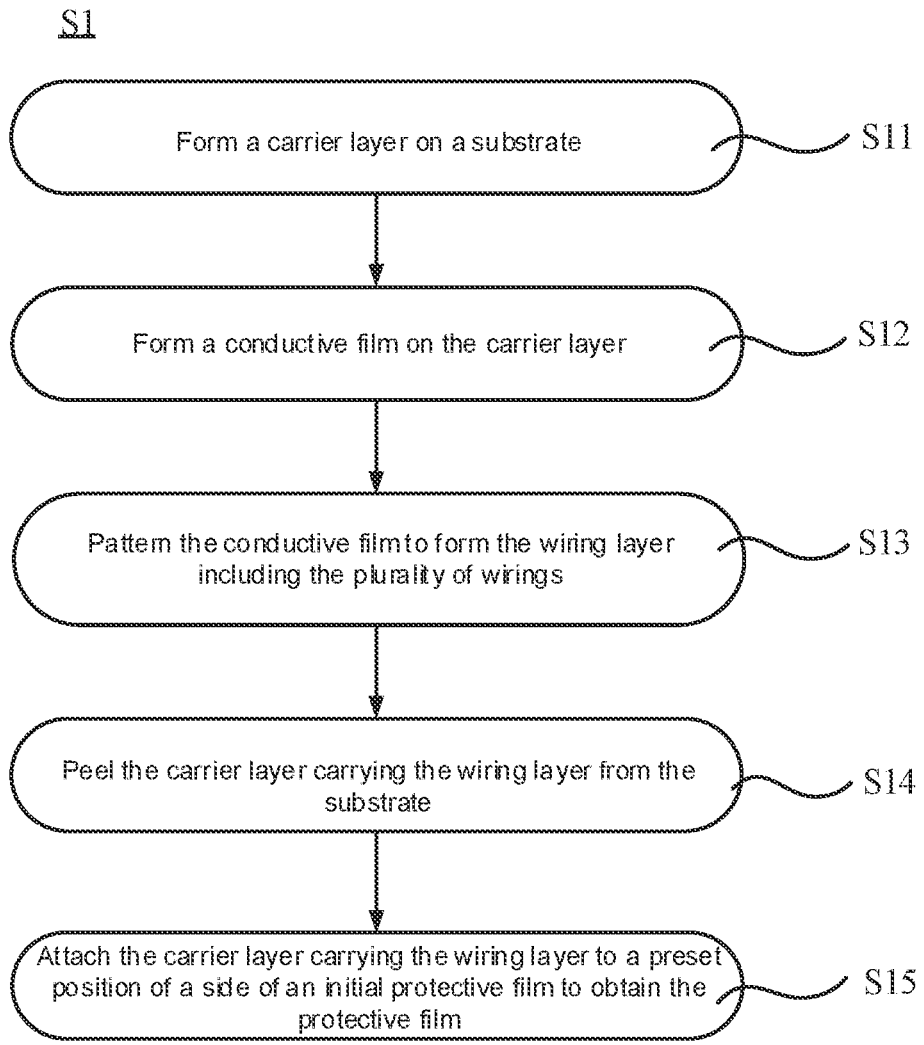
FIG. 10 is a flow diagram of S1 of the manufacturing method in FIG. 9.

For example, as shown in FIG. 10, S1, i.e., manufacturing the protective film 2, includes following S11 to S15.

Figure 13:
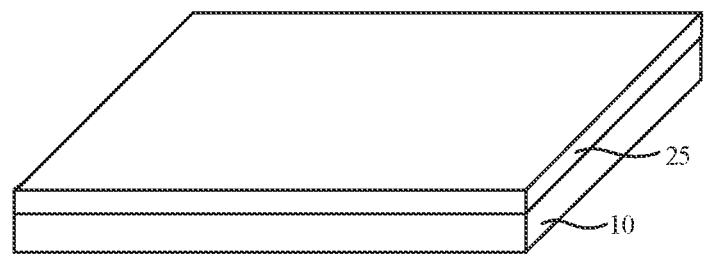
FIGS. 13 to 20 are diagrams showing steps of manufacturing a display panel, in accordance with some embodiments.

In S11, as shown in FIG. 13, a carrier layer 25 is formed on a substrate 10.

Figure 14:
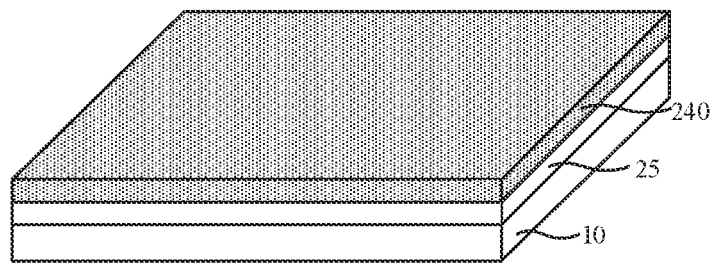

In S12, as shown in FIG. 14, a conductive film 240 is formed on the carrier layer 25.

The carrier layer 25 serves as a carrier for the conductive film 240, which may facilitate patterning of the conductive film 240.

Figure 15:
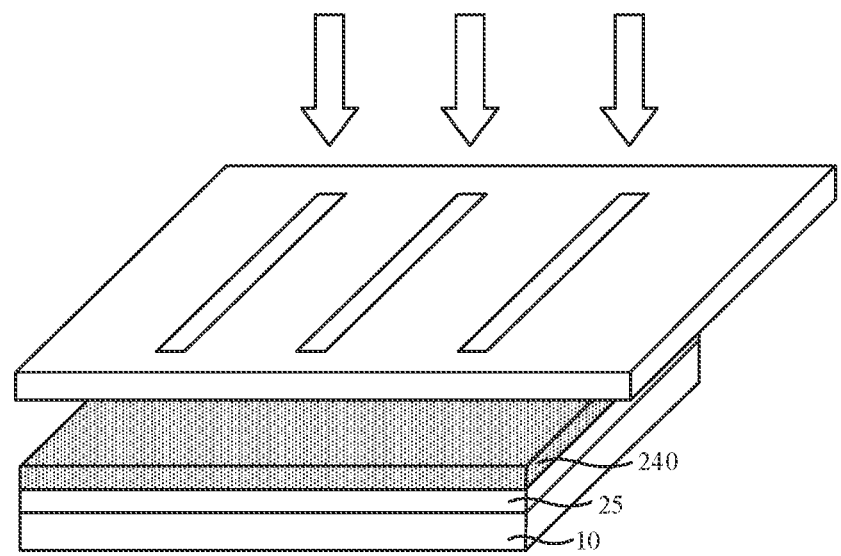
Figure 16:
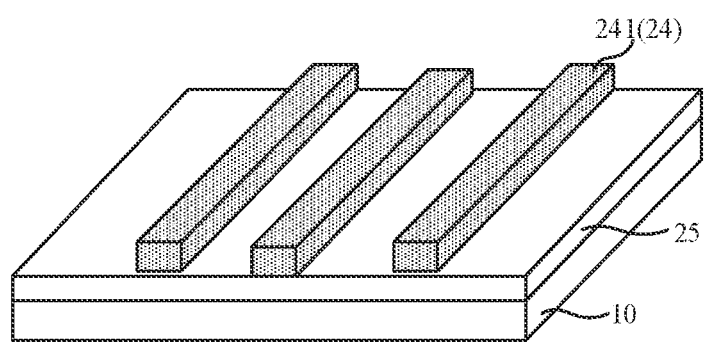

In S13, as shown in FIGS. 15 and 16, the conductive film 240 is patterned to form the wiring layer 24 including the plurality of wirings 241.

For example, a material of the conductive film 240 includes a photosensitive conductive material. As shown in FIG. 15, the conductive film 240 is exposed by ultraviolet light using a mask. As shown in FIG. 16, the exposed conductive film 240 is developed and cured by heating to obtain the wiring layer 24 including the plurality of wirings 241.

Figure 17:
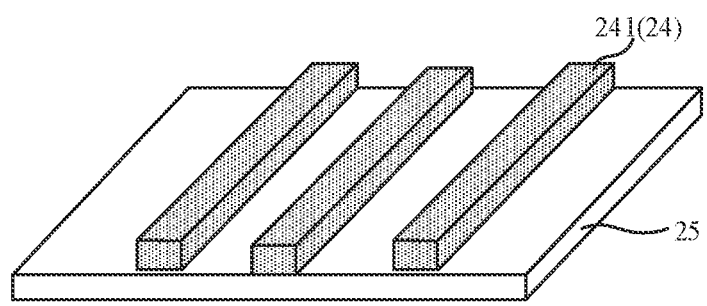

In S14, as shown in FIG. 17, the carrier layer 25 carrying the wiring layer 24 is peeled from the substrate 10.

For example, the carrier layer 25 carrying the wiring layer 24 is peeled from the substrate 10 by laser lift-off (LLO), so as to facilitate the transfer and attachment of the wiring layer 24.

In S15, as shown in FIGS. 18 and 19, the carrier layer 25 carrying the wiring layer 24 is attached to a preset position of a side of an initial protective film 8 to obtain the protective film 2.

In combination with FIGS. 18 and 19, the initial protective film 8 includes the first protective portion 21 and the main film layer 23 of the second protective portion 22. In combination with FIGS. 19 and 20, the "preset position" of the initial protective film 8 refers to a surface of the main film layer 23 of the second protective portion 22 configure to be proximate to the display substrate 1.

It will be noted that referring to FIG. 18, in S13, in a process of patterning the conductive film 240 to form the plurality of wirings 241, patterns of the wiring layer 24 and a layout of the patterns on the carrier layer 25 are determined. Then, the carrier layer 25 carrying the wiring layer 24 is attached to the initial protective film 8 to obtain the protective film 2.

Figure 20:
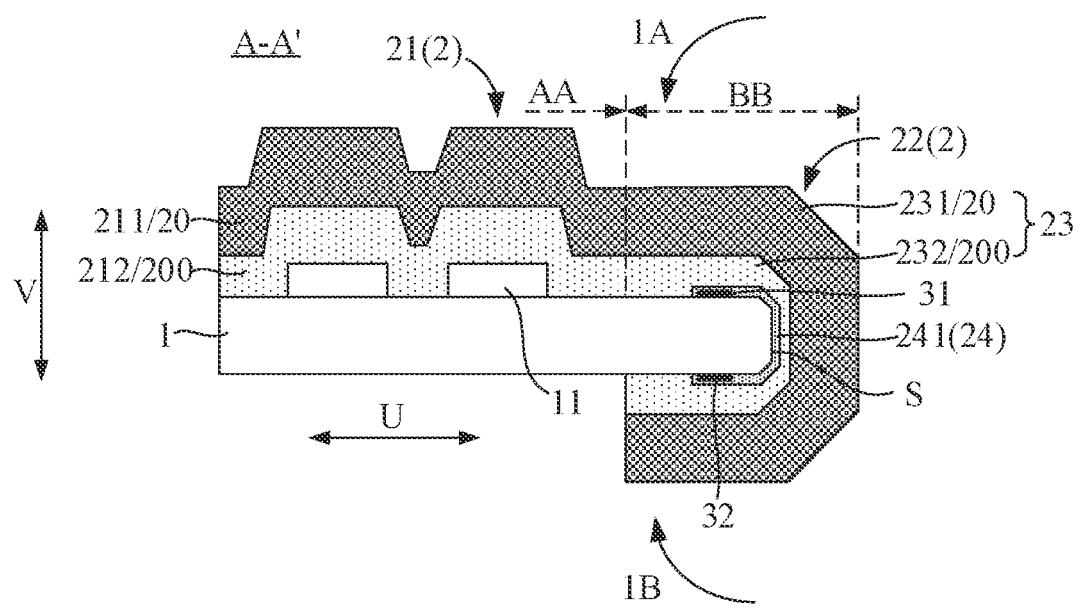

In S2, the protective film 2 is attached to the display substrate 1. Referring to FIG. 20, the first protective portion 21 of the protective film 2 is located on a display side 1A of the display substrate 1, and covers the display area AA. The second protective portion(s) 22 each cover a wiring area BB, and is bent from the display side 1A of the display substrate 1 to a non-display side 1B of the display substrate 1, by a side S of the display substrate 1. At least one wiring 241 of the wiring layer 24 extends from the display side 1A of the display substrate 1 to the non-display side 1B of the display substrate 1, by the side S of the display substrate 1.

Figure 11:
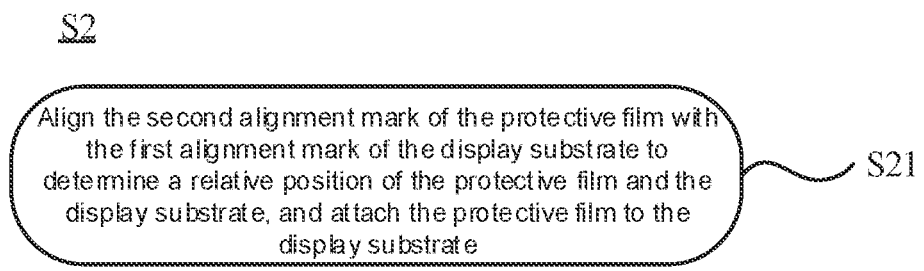
FIG. 11 is a flow diagram of S2 of the manufacturing method in FIG. 9.

For example, as shown in FIG. 7, the display substrate 1 includes at least one first alignment mark 4. As shown in FIG. 6, the protective film 2 includes at least one second alignment mark 5. In this case, as shown in FIG. 11, S2, i.e., attaching the protective film 2 to the display substrate 1, includes following S21.

In S21, the second alignment mark 5 of the protective film 2 is aligned with the first alignment mark 4 of the display substrate 1 to determine a relative position of the protective film 2 and the display substrate 1, and the protective film 2 is attached to the display substrate 1. Thus, a position of the protective film 2 attached to the display substrate 1 may be accurately controlled, and a position of the wirings 241 attached to the display substrate 1 may be accurately controlled.

It will be noted that in S13, in the process of patterning the conductive film 240 to form the plurality of wirings 241, the second alignment mark(s) 5 may be formed. That is, the wiring layer 24 may further include the second alignment mark(s) 5.

In the related art, in a process of manufacturing wirings located on a side of the display substrate, firstly, a display area of the display substrate is covered with a shielding film layer, and a wiring area of the display substrate is cleaned by laser cleaning, so that a cleanliness of a surface of the display substrate is improved, which is conducive to improving an adhesion between a film layer on the display substrate and the surface of the display substrate. Then, a plurality of wirings are formed in the wiring area of the display substrate by sputtering and laser etching. The shielding film layer is used for preventing the conductive material from penetrating into the display area in the film forming process. However, part of the conductive material penetrates into the display area along a gap between the shielding film layer and the display substrate, which may cause a short circuit in the display area.

In the above manufacturing method, in the process of manufacturing the protective film 2, the wiring layer 24 is disposed on the side of the main film layer 23 of the protective film 2 proximate to the display substrate 1. In this way, in the process of attaching the protective film 2 to the display substrate 1, the wiring(s) 241 of the wiring layer 24 follow the second protective portion 22, and are bent from the display side 1A of the display substrate 1 to the non-display side 1B of the display substrate 1 by the side S of the display substrate 1, so that the manufacturing process of the wiring(s) located on the side S is simplified, and the short circuit of the display area due to the penetration of the conductive material into the display area by sputtering is avoided.

Moreover, in the process of attaching the protective film 2 to the display substrate 1, the second protective portion 22 of the protective film 2 is bent from the display side 1A of the display substrate 1 to the non-display side 1B of the display substrate 1, by the side S of the display substrate 1. That is, along the plane direction U of the display substrate 1, the portion of the protective film 2 exceeding the display substrate 1 is bent to the non-display side 1B of the display substrate 1 by the side S of the display substrate 1, so that the portion of the protective film 2 exceeding the display substrate 1 may be prevented from being cut off by laser cutting, and the display substrate 1 is prevented from being damaged by cutting the edge portion of the display substrate 1. Moreover, the second protective portion 22 wraps the edge portion of the display substrate 1 (i.e., the wiring area BB and the side S of the display substrate 1), so that the problem of light leakage from the edge region of the display substrate 1 may be solved.

In addition, compared with the case that the safety distance P is reserved between the position of the protective film 2' for laser cutting and the display substrate 1' in FIG. 22 such that the portion of the protective film 2' exceeding the edge of the display substrate 1' causes a wider splicing seam between the display panels (the width of the splicing seam is twice the safety distance P), referring to FIG. 2, the plurality of display panels 100 are spliced together, and the width of the splicing seam between two adjacent display panels 100 is smaller (the width of the splicing seam is twice the thickness of the protective film 2, and the thickness of the protective film 2 is less than the safety distance P), so that the quality of the display image of the spliced large-size display panel may be improved.

Figure 12:
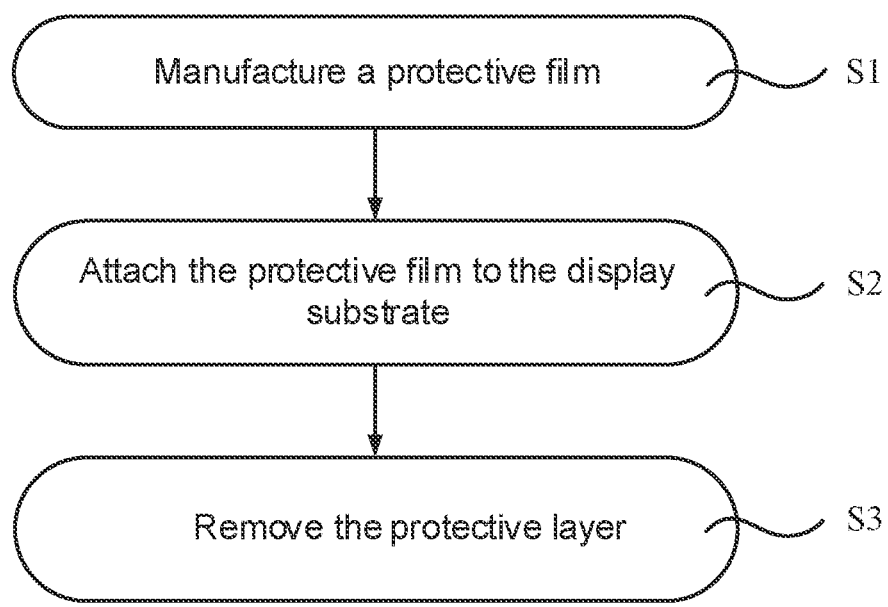
FIG. 12 is a flow diagram of another manufacturing method of a display panel, in accordance with some embodiments.

In some embodiments, as shown in FIG. 19, the protective film 2 further includes a protective layer 26. The protective layer 26 covers the first protective portion 21 and the second protective portion(s) 22, and is located on a side of the main film layer 23 away from the wiring layer 24. In this case, as shown in FIG. 12, after S2, i.e., after the protective film is attached to the display substrate, the manufacturing method further includes following S3.

In S3, the protective layer 26 is removed. For example, the protective layer 26 may be a release film. In the process of manufacturing the display panel 100, the release film functions to protect the protective film 2.

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
    a display substrate having a display area and at least one wiring area each located on a side of the display area; and
    a protective film including a first protective portion and at least one second protective portion; wherein the first protective portion is disposed on a display side of the display substrate, and covers the display area; and the at least one second protective portion each covers a wiring area in the at least one wiring area, and is bent from the display side of the display substrate to a non-display side of the display substrate, by a side of the display substrate;
    wherein the at least one second protective portion each includes a main film layer and a wiring layer disposed on a side of the main film layer proximate to the display substrate; and the wiring layer includes a plurality of wirings, and at least one wiring extends from the display side of the display substrate to the non-display side of the display substrate, by the side of the display substrate;
    wherein the first protective portion includes a first black adhesive layer, the main film layer includes a second black adhesive layer, and the first black adhesive layer and the second black adhesive layer are integrally formed; and
    the wiring layer is located on a side of the second black adhesive layer proximate to the display substrate.

2. The display panel according to claim 1, wherein the first protective portion further includes a first white adhesive layer disposed on a side of the first black adhesive layer proximate to the display substrate; and
    the main film layer further includes a second white adhesive layer disposed between the second black adhesive layer and the wiring layer;
    wherein the first white adhesive layer and the second white adhesive layer are integrally formed.

3. The display panel according to claim 1, wherein the second protective portion further includes a carrier layer disposed between the main film layer and the wiring layer; and
    the wiring layer is fixed to the carrier layer, and the carrier layer is adhered to the main film layer.

4. The display panel according to claim 1, wherein a material of the wiring layer includes a photosensitive conductive material.

5. The display panel according to claim 1, wherein the first protective portion and the main film layer are integrally formed.

6. The display panel according to claim 1, wherein the display substrate includes at least one first alignment mark; and
    the protective film further includes at least one second alignment mark located on the display side of the display substrate; and the at least one second alignment mark is configured to be aligned with the at least one first alignment mark to determine a relative position of the protective film and the display substrate.

7. The display panel according to claim 1, wherein the display substrate includes first pins and second pins that are all located in the wiring area; the first pins are disposed on the display side of the display substrate, and the second pins are disposed on the non-display side of the display substrate; and an end of each of the at least one wiring is coupled to a first pin in the first pins, and another end of each of the at least one wiring is coupled to a second pin in the second pins.

8. The display panel according to claim 1, wherein the at least one wiring area includes a first wiring area and a second wiring area respectively located on two opposite sides of the display area; and the at least one second protective portion includes two second protective portions respectively located on two opposite sides of the first protective portion; wherein one of the two second protective portions covers the first wiring area, and is bent from the display side of the display substrate to the non-display side of the display substrate, by a side of the display substrate corresponding to the first wiring area; and another one of the two second protective portions covers the second wiring area, and is bent from the display side of the display substrate to the non-display side of the display substrate, by another side of the display substrate corresponding to the second wiring area.

9. A display device comprising the display panel according to claim 1.

10. The display panel according to claim 2, wherein the display substrate includes at least one first alignment mark; and the protective film further includes at least one second alignment mark located on the display side of the display substrate; and the at least one second alignment mark is configured to be aligned with the at least one first alignment mark to determine a relative position of the protective film and the display substrate.

11. A manufacturing method of a display panel, wherein the display panel includes a display substrate, and the display substrate has a display area and at least one wiring area each located on a side of the display area;

the manufacturing method comprising:

manufacturing a protective film; wherein the protective film includes a first protective portion and at least one second protective portion each located on a side of the first protective portion; the at least one second protective portion each includes a main film layer and a wiring layer disposed on a side of the main film layer, and the wiring layer including a plurality of wirings; and attaching the protective film to the display substrate, so that the first protective portion is locate on a display side of the display substrate and covers the display area, and the at least one second protective portion each covers a wiring area in the at least one wiring area, and is bent from the display side of the display substrate to a non-display side of the display substrate, by a side of the display substrate; and at least one wiring of the wiring layer extends from the display side of the display substrate to the non-display side of the display substrate, by the side of the display substrate;

wherein the display substrate includes at least one first alignment mark, and the protective film further includes at least one second alignment mark; and attaching the protective film to the display substrate, includes:

aligning the second alignment mark of the protective film with the first alignment mark of the display substrate to determine a relative position of the protective film and the display substrate; and attaching the protective film to the display substrate.

12. The manufacturing method according to claim 11, wherein manufacturing the protective film, includes:

forming a carrier layer on a substrate;

forming a conductive film on the carrier layer;

patterning the conductive film to form the wiring layer including the plurality of wirings;

peeling the carrier layer carrying the wiring layer from the substrate; and attaching the carrier layer carrying the wiring layer to a preset position of a side of an initial protective film to obtain the protective film; wherein the initial protective film includes the first protective portion and the main film layer of the second protective portion, and the preset position is a surface of the main film layer proximate to the display substrate.

13. The manufacturing method according to claim 11, wherein the protective film further includes a protective layer, and the protective layer covers the first protective portion and the second protective portion, and is located on a side of the main film layer away from the wiring layer; and the manufacturing method further comprises:

removing the protective layer after the protective film is attached to the display substrate.

14. A display panel, comprising:

a display substrate having a display area and at least one wiring area each located on a side of the display area; and a protective film including a first protective portion and at least one second protective portion; wherein the first protective portion is disposed on a display side of the display substrate, and covers the display area; and the at least one second protective portion each covers a wiring area in the at least one wiring area, and is bent from the display side of the display substrate to a non-display side of the display substrate, by a side of the display substrate;

wherein the at least one second protective portion each includes a main film layer and a wiring layer disposed on a side of the main film layer proximate to the display substrate; and the wiring layer includes a plurality of wirings, and at least one wiring extends from the display side of the display substrate to the non-display side of the display substrate, by the side of the display substrate;

wherein the display substrate includes at least one first alignment mark; and the protective film further includes at least one second alignment mark located on the display side of the display substrate; and the at least one second alignment mark is configured to be aligned with the at least one first alignment mark to determine a relative position of the protective film and the display substrate.

15. The display panel according to claim 14, wherein the display substrate further includes at least one third alignment mark; and the protective film further includes at least one fourth alignment mark located on the non-display side of the display substrate; and the at least one fourth alignment mark is configured to be aligned with the at least one third alignment mark to determine the relative position of the protective film and the display substrate.

16. The display panel according to claim 14, wherein the second alignment mark and the plurality of wirings are made of a same material, and are arranged in a same layer.

17. The display panel according to claim 15, wherein the second alignment mark, the fourth alignment mark, and the plurality of wirings are made of a same material, and are arranged in a same layer.

18. The display panel according to claim 14, wherein the at least one wiring area includes a first wiring area and a second wiring area respectively located on two opposite sides of the display area; and
the at least one second protective portion includes two second protective portions respectively located on two opposite sides of the first protective portion; wherein
one of the two second protective portions covers the first wiring area, and is bent from the display side of the display substrate to the non-display side of the display substrate, by a side of the display substrate corresponding to the first wiring area; and another one of the two second protective portions covers the second wiring area, and is bent from the display side of the display substrate to the non-display side of the display substrate, by another side of the display substrate corresponding to the second wiring area.

19. The display panel according to claim 15, wherein the at least one wiring area includes a first wiring area and a second wiring area respectively located on two opposite sides of the display area; and
the at least one second protective portion includes two second protective portions respectively located on two opposite sides of the first protective portion; wherein
one of the two second protective portions covers the first wiring area, and is bent from the display side of the display substrate to the non-display side of the display substrate, by a side of the display substrate corresponding to the first wiring area; and another one of the two second protective portions covers the second wiring area, and is bent from the display side of the display substrate to the non-display side of the display substrate, by another side of the display substrate corresponding to the second wiring area.

20. A display device, comprising the display panel according to claim 14.

* * * * *